United States Patent [19]

Schiemenz et al.

[11] Patent Number: 4,810,949

[45] Date of Patent: Mar. 7, 1989

[54] DIGITALLY CONTROLLED MONOTONIC ATTENUATOR

[75] Inventors: Arthur F. Schiemenz, Springtown; Daniel J. Husliq, Bedford, both of Tex.

[73] Assignee: Motorola, Inc., Schaumburg, Ill.

[21] Appl. No.: 174,290

[22] Filed: Mar. 28, 1988

[51] Int. Cl.[4] .............................................. G05F 3/08
[52] U.S. Cl. .................................. 323/354; 333/81 R; 307/540
[58] Field of Search ............ 333/81 R; 307/264, 540; 323/297, 352, 353, 354

[56] References Cited

U.S. PATENT DOCUMENTS

| | | | |
|---|---|---|---|
| 3,015,790 | 1/1962 | Eisaman et al. | 323/354 |
| 4,280,089 | 7/1981 | van de Plassche et al. | 323/354 |
| 4,489,270 | 12/1984 | Diller | 323/354 |
| 4,521,764 | 6/1985 | Burton | 323/354 |
| 4,549,131 | 10/1985 | Kusazaki | 323/354 |
| 4,550,400 | 10/1985 | Henderson et al. | 370/85 |
| 4,683,386 | 7/1987 | Kamikawara | 333/81 R |

Primary Examiner—Peter S. Wong
Attorney, Agent, or Firm—Thomas G. Berry

[57] ABSTRACT

At least two attenuator banks are intercoupled in a cascaded arrangement, wherein the signal across each subsequent attenuator bank comprises a differential signal representing a selected attenuation (or voltage) step of the preceding attenuator bank. In this way monotonic attenuator operation is assured.

20 Claims, 2 Drawing Sheets

DIGITALLY CONTROLLED MONOTONIC ATTENUATOR

TECHNICAL FIELD

This invention relates generally to attenuators, and more specifically to monotonic attenuators, and is more particularly directed toward digitally controlled monotonic attenuators.

BACKGROUND ART

Digitally controlled attenuators are known. Typically, such attenuators comprise a resistive divider network coupled to a multiplexer, which may be controlled to route an attenuated version of an input signal to an output port. The problem with conventional attenuators, however, is that they often provide non-monotonic attenuation, particularly when large numbers of small attenuation steps are required. That is, when the attenuator is controlled to select the next highest attenuated signal, the actual output signal actually increases (i.e., lower attenuation) in amplitude (and vice versa).

To solve this problem, some attenuator designers have employed high precision parts (for example, resistors having a 1% or better tolerance). However, this practice greatly increases the cost of the attenuator without fully solving the non-monotonic operation of the attenuator.

Accordingly it is an object of the present invention to provide a monotonic digitally controlled attenuator having a large number of attenuation steps.

It is a further object of the present invention to provide a monotonic digitally controlled attenuator that may be implemented with low precision (i.e., resistors having a 5% tolerance) components.

SUMMARY OF THE INVENTION

Briefly, according to the invention, at least two attenuator banks are intercoupled in a cascaded arrangement, wherein the signal across each subsequent attenuator bank comprises a differential signal representing a selected attenuation (or voltage) step of the preceding attenuator bank. In this way monotonic attenuator operation is assured.

DETAILED DESCRIPTION OF THE PREFERRED EMBODIMENT

Figure 1:
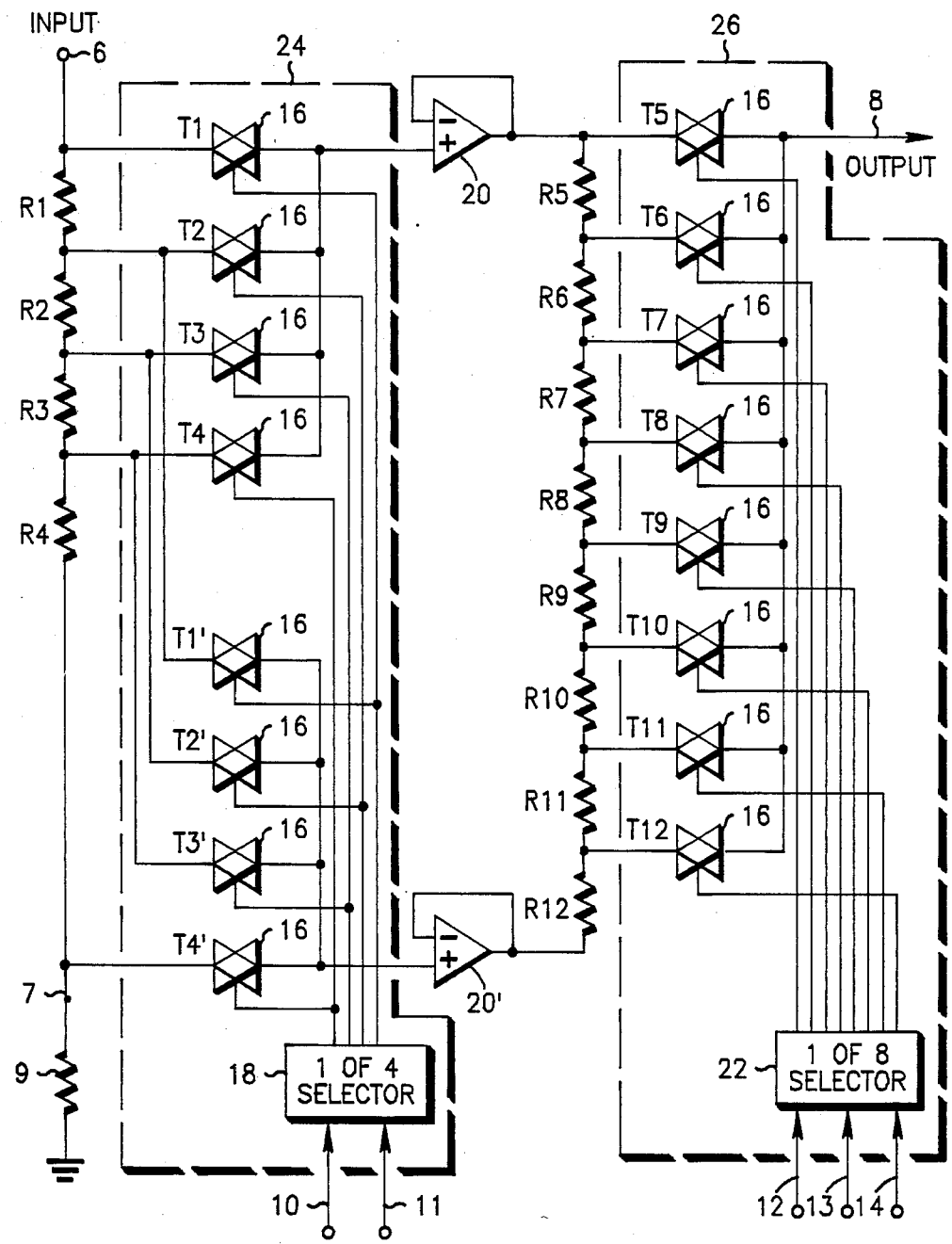
FIG. 1 is a schematic diagram of a preferred embodiment of the/present invention.

Referring now to FIG. 1, there is shown a schematic diagram of a preferred embodiment of the present invention. The attenuator illustrated in FIG. 1 comprises two intercoupled attenuator banks. The first attenuator bank includes a resistive network (R1-R4) and a selection network (24). The second attenuator bank comprises another resistive network (R5-R12) coupled to a second selection network (26). The two attenuator banks are coupled by operational amplifiers (20 and 20') arranged in a unity gain configuration to provide isolation from one attenuator bank to the next. Preferably, the operational amplifiers comprises an LM324 integrated circuit manufactured by Motorola, Inc, or its functional equivalent, although other isolation amplifiers may be used.

Operationally, an input signal is applied to an input port (6), which applies the input signal to the resistive network (R1-R4), which is coupled to an audio ground potential (7). The resistor (9) sets the audio ground (7) potential and operates in recognition of the fact that the attenuator cannot go from its minimum attenuation (whatever value that may be) to a theoretical infinite attenuation in one step. Preferably, the resistor (9) has a value of approximately three ohms.

In a linear attenuation embodiment, the values of L the resistors comprising the resistive network (R1-R4) are selected to provide a predetermined voltage step size. That is, the voltage drop across one resistor (R1) is substantially the same as the voltage drop across each of the other resistors (R2-R4). Alternately, the resistor values may be selected to provide logarithmic attenuation, in which case the attenuation (in dB) across one resistor (R1) is substantially the same as the attenuation (in dB) across each of the other resistors (R2-R4). The plurality of attenuated voltage signals supplied by the resistive network (R1-R4) are coupled to a selection network (24). Preferably, the selection network (24) is realized as an MC14052B integrated circuit manufactured by Motorola, Inc., or its functional equivalent.

The selection network (24) operates to accept two control signals (10 and 11), which may be binary control signals supplied by a microprocessor or other suitable control device (not shown). The control signals (10 and 11) are interpreted (18) to select a differential voltage potential across any one of the resistors in the resistive network (R1-R4) by activating selected transmission gates (16) within the selection network (24). Thus, transmission gates T1 and T1' route the differential voltage across resistor (R1) to the operational amplifiers 20 and 20'. Transmission gates T2 and T2' select the differential potential across resistor (R2) and so on. The buffered selected signals provided by the operational amplifiers (20 and 20'), are coupled to the second resistive network (R5-R12), which divides the selected signal into a plurality of further attenuated signals in the same manner that the first resistive network (R1-R4) divided the input signal. The values of the second resistive network (R5-R12), are selected to provide an attenuation step sized related to the step size of the first resistive network (R1-R4). That is, if the attenuation step in the first attenuator bank of a logarithmic attenuator has an 18 dB attenuation step size, and the second attenuator bank has eight steps, the values of the second resistor network (R5-R12) are selected to provide 2.25 dB steps (i.e., 18 divided by 8 equals 2.25).

To provide monotonic attenuation, the attenuator of FIG. 1 operates to first select transmission gates T1 and T1', and then sequentially select the voltage potentials from the resistors (R5) through (R12) by applying control signals (12-14) to the one-of-eight selector (22) of the second selection network (26). Preferably, the selection network (26) comprises an MC14051B integrated circuit manufactured by Motorola, Inc., or its functional equivalent. Next, transmission gates T2 and T2' are activated to supply the differential voltage potential across resistor (R2) to the second resistive network (R5-R12). Again, the second attenuator network sequentially activates its transmission gates (T5-T12), after which transmission gates T3 and T3' are selected and so on. Since the signal applied to the second resistive network (R5 and R12) represents the differential voltage across a selected resistor of the first resistive network (R1-R4), monotonic operation is assured. As used herein, monotonic operation means that whenever an increased attenuation factor is selected the amplitude of the output signal in fact decreases (and vice versa). Non-monotonic operation means that while an increased attenuation factor may be selected, it is possible that the output amplitude actually increases (i.e., less attenuation), notwithstanding the fact that an increased attenuation step was indicated.

The monotonic attenuator of Figure provides 32 attenuation steps (i.e., 4×8=32). As an example and not as a limitation, the resistor values provided in Table 1 realize a 32 step monotonic logarithmic attenuator, having a 72 dB attenuation range with a 2.25 dB resolution, wherein the first attenuator bank operates in 18 dB steps and the second attenuator bank operates in 2.25 dB steps.

TABLE 1

| RESISTOR | VALUE |
| --- | --- |
| R1 | 220K |
| R2 | 27K |
| R3 | 3.6K |
| R4 | 470 |
| R5 | 23K |
| R6 | 18K |
| R7 | 13K |
| R8 | 11K |
| R9 | 8.2K |
| R10 | 6.8K |
| R11 | 4.7K |
| R12 | 3.3K |

Figure 2:
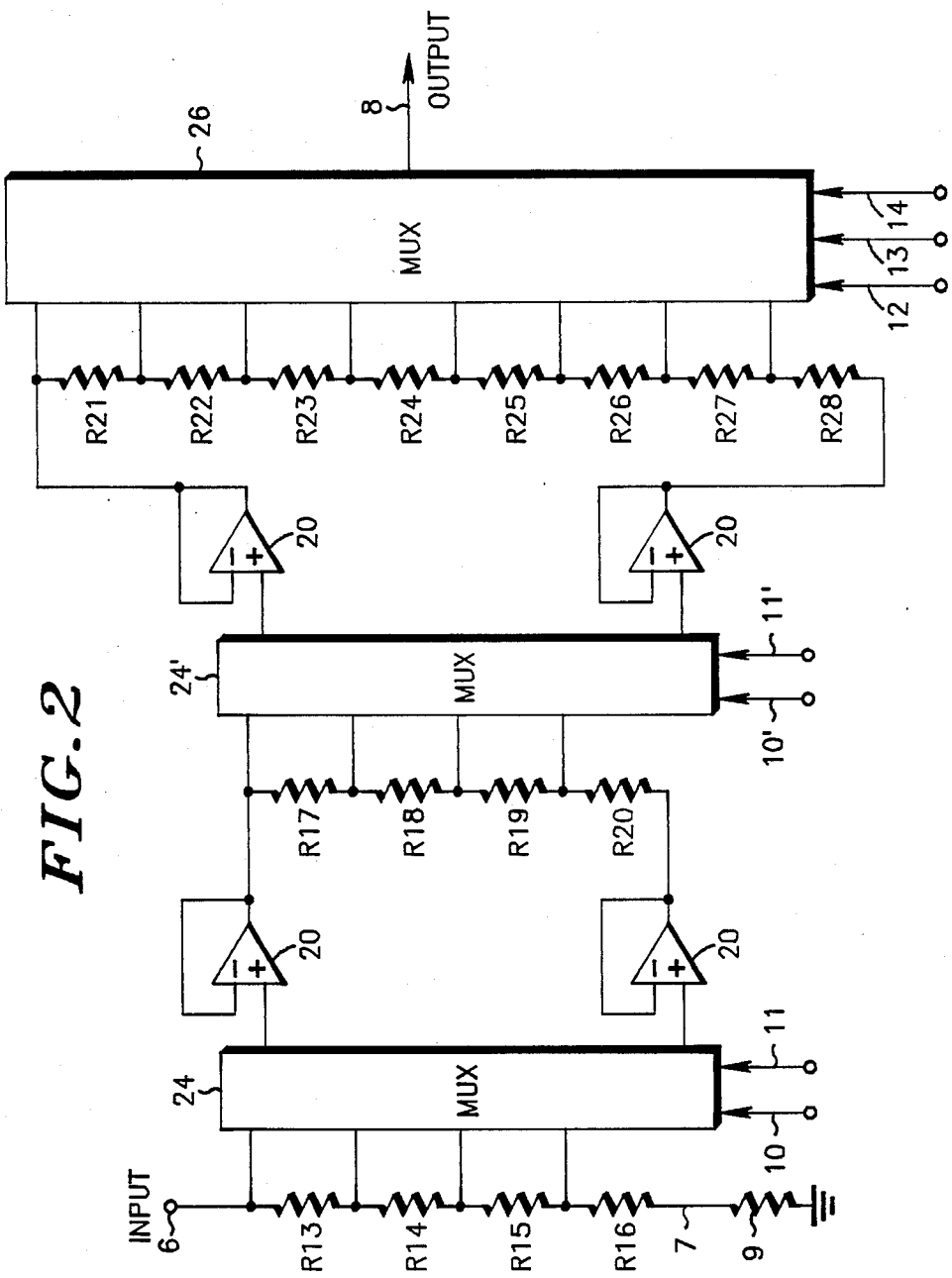
FIG. 2 is a schematic diagram of another preferred embodiment of the present invention.

Referring now to FIG. 2, another preferred embodiment of the present invention is shown. The monotonic attenuator of FIG. 2 provides 3 attenuation banks. The first attenuator bank has a first resistive network (R13-R16) coupled to a first selection network (24). The second attenuator bank has a second resistive network (R17-R20), which is coupled to a second selection network (24'). The third attenuator bank consists of a third resistive network (R21-R28) coupled to a third selection network (26). Each attenuator bank is intercoupled by operational amplifiers (20) arranged in a unity gain fashion to provide isolation between attenuator banks.

The monotonic attenuator of FIG. 2 provides 128 attenuation steps (i.e., 4×4×8=128). As an example, and not as a limitation, Table 2 lists the preferred resistor values to provide a monotonic logarithmic attenuator having a 72 dB attenuation range with a resolution of 0.56 dB. The resistor values of the first resistive network (R13-R16) are selected to provide 18 dB attenuation steps. Therefore, according to the present invention, the resistive values of the resistive divider network (R17-R20) are selected to provide 4.5 dB steps (i.e., 18 divided by 4). Thus, the resistive values of the third resistive network (R21-R28) are selected to provide attenuation of 0.56 dB (i.e., 4.5 divided by 8).

TABLE 2

| RESISTOR | VALUE |
| --- | --- |
| R13 | 22K |
| R14 | 2.5K |
| R15 | 330 |
| R16 | 52 |
| R17 | 55K |
| R18 | 33K |
| R19 | 20K |
| R20 | 12K |

TABLE 2-continued

| RESISTOR | VALUE |
| --- | --- |
| R21 | 1.5K |
| R22 | 1.5K |
| R23 | 1.3K |
| R24 | 1.2K |
| R25 | 1.2K |
| R26 | 1.2K |
| R27 | 1K |
| R28 | 1K |

In summary, the present invention provides a digitally controlled monotonic attenuator consisting of two or more attenuation banks cascaded together, wherein the signal across each subsequent attenuator bank comprises a differential signal representing a selected attenuation (or voltage) step of the preceding attenuator bank. Preferably, each subsequent attenuator bank has an attenuation (or voltage) step size related to the attenuation (or voltage) step size of the preceding attenuator bank. According to the present invention, any number of attenuator banks may be coupled together and any attenuation range with any resolution by be obtained. In this way, monotonic operation is assured irrespective of resistor tolerance, and even if a large number of small attenuation (or voltage) steps is required in the implementation.

What is claimed is:

1. A monotonic attenuator apparatus comprising at least two attenuator banks coupled in a cascaded arrangement wherein an input signal across each subsequent attenuator bank comprises a differential signal representing a selected attenuation step of a preceding attenuator bank.

2. A monotonic attenuator apparatus, comprising:
at least two attenuator banks, each comprising: means for dividing an input signal to provide a plurality of differential output signals; means for selecting at least one of said plurality of differential output signals in response to a control signal;
means for intercoupling said at least two attenuator banks.

3. The apparatus of claim 2, wherein said means for dividing comprises a resistive divider circuit.

4. The apparatus of claim 3, wherein each resistor of said resistive divider circuit has a value tolerance greater than one percent.

5. The apparatus of claim 2, wherein said means for selecting comprises at least one multiplexer.

6. The apparatus of claim 2, wherein said means for intercoupling comprises at least two isolation amplifiers.

7. The apparatus of claim 2, wherein said means for intercoupling comprises at least two operational amplifiers.

8. The apparatus of claim 7, wherein said at least two operational amplifiers are constructed and arranged to have unity gain.

9. A method for digitally controlling an attenuator, comprising the steps of:
(a) dividing an input signal to provide a plurality of differential signals;
(b) selecting at least one of said plurality of differential signals to provide at least one selected signal;
(c) dividing said at least one selected signal to provide a plurality of attenuated signals;

(d) selecting at least one of said plurality of attenuated signals to provide at least one attenuated output signal.

10. A method for digitally controlling an attenuator, comprising the steps of:
   (a) dividing an input signal to provide a plurality of first differential signals;
   (b) selecting at least one of said plurality of first differential signals to provide at least one first selected signal;
   (c) dividing said at least one first selected signal to provide a plurality of second differential signals;
   (d) selecting at least one of said plurality of second differential signals to provide at least one second selected signal;
   (e) dividing said at least one second selected signal to provide a plurality of attenuated signals;
   (f) selecting at least one of said plurality of attenuated signals to provide at least one attenuated output signal.

11. A monotonic attenuator apparatus, comprising:
   a first attenuator bank, comprising: means for dividing an input signal to provide a series of attenuated signals each representing a more attenuated version of said input signal than any preceding attenuated signal in said series of attenuated signals; means for selecting at least two of said series of attenuated signals to provide a differential signal;
   at least one other attenuator bank, comprising: means for dividing said differential signal to provide a series of attenuated signals; means for selecting at least one of said series of attenuated signals to provide an output signal; and
   intercoupling means, disposed between said first attenuator bank and said at least one other attenuator bank, for intercoupling the same.

12. A monotonic attenuator apparatus, comprising:
   at least two attenuator banks, each comprising: means for dividing an input signal to provide a series of attenuated signals each representing an more attenuated version of said input signal than any preceding attenuated signal in said series of attenuated signals;
   means for selecting at least one of said series of attenuated signals in response to a control signal to provide an output signal;
   intercoupling means, disposed between said at least two attenuator banks, for intercoupling the same.

13. The apparatus of claim 12, wherein said means for dividing comprises a resistive divider circuit.

14. The apparatus of claim 13, wherein each resistor of said resistive divider circuit has a value tolerance greater than one percent.

15. The apparatus of claim 12, wherein said means for selecting comprises at least one multiplexer.

16. The apparatus of claim 12, wherein said means for intercoupling comprises at least two isolation amplifiers.

17. The apparatus of claim 12, wherein said means for intercoupling comprises at least two operational amplifiers.

18. The apparatus of claim 17, wherein said at least two operational amplifiers are constructed and arranged to have unity gain 19. The apparatus of claim 12, wherein said dividing means divides said input signal in accordance with a predetermined attenuation step size related to the attenuation step size of any preceding attenuator bank.

20. The apparatus of claim 12, wherein said control signal comprises at least one digital signal.

* * * * *